US012622009B2

(12) United States Patent
Lin et al.

(10) Patent No.: US 12,622,009 B2
(45) Date of Patent: May 5, 2026

(54) DMOS DEVICE HAVING JUNCTION FIELD PLATE AND MANUFACTURING METHOD THEREFOR

(71) Applicants: CSMC TECHNOLOGIES FAB2 CO., LTD., Wuxi (CN); SOUTHEAST UNIVERSITY, Nanjing (CN)

(72) Inventors: Feng Lin, Wuxi (CN); Chaoqi Xu, Wuxi (CN); Shuxian Chen, Wuxi (CN); Chunxu Li, Wuxi (CN); Li Lu, Nanjing (CN); Siyang Liu, Nanjing (CN); Weifeng Sun, Nanjing (CN)

(73) Assignees: CSMC TECHNOLOGIES FAB2 CO., LTD., Wuxi (CN); SOUTHEAST UNIVERSITY, Nanjing (CN)

( * ) Notice: Subject to any disclaimer, the term of this patent is extended or adjusted under 35 U.S.C. 154(b) by 350 days.

(21) Appl. No.: 18/684,175

(22) PCT Filed: Dec. 20, 2022

(86) PCT No.: PCT/CN2022/140340
§ 371 (c)(1),
(2) Date: Feb. 15, 2024

(87) PCT Pub. No.: WO2023/125145
PCT Pub. Date: Jul. 6, 2023

(65) Prior Publication Data
US 2024/0222473 A1 Jul. 4, 2024

(30) Foreign Application Priority Data

Dec. 31, 2021 (CN) .......................... 202111682019.5

(51) Int. Cl.
H10D 30/01 (2025.01)
H10D 30/66 (2025.01)
(Continued)

(52) U.S. Cl.
CPC ....... *H10D 30/0297* (2025.01); *H10D 30/668* (2025.01); *H10D 62/106* (2025.01); (Continued)

(58) Field of Classification Search
CPC ..... H10D 30/028–0297; H10D 30/658; H10D 30/668; H10D 30/664; H10D 30/66; H10D 30/663
See application file for complete search history.

(56) References Cited

U.S. PATENT DOCUMENTS 5,122,848 A * 6/1992 Lee ...................... H10D 30/025
257/E21.652
5,701,026 A * 12/1997 Fujishima .............. H10D 30/64
257/E21.418
(Continued)

FOREIGN PATENT DOCUMENTS

CN 109192667 A 1/2019
CN 111725071 A 9/2020
(Continued)

OTHER PUBLICATIONS

ISA State Intellectual Property Office of the People's Republic of China, International Search Report Issued in Application No. PCT/CN2022/140340, Mar. 8, 2023, WIPO, 4 pages.
(Continued)

*Primary Examiner* — Evren Seven
(74) *Attorney, Agent, or Firm* — Christopher R. Carroll; Carroll, Hoette & Butscher, LLC

(57) ABSTRACT
The present disclosure provides a DMOS device with a junction field plate and its manufacturing method. A drain region is located on a surface of a semiconductor substrate. A source region is located in the semiconductor substrate at a bottom of a first trench. A gate electrode is located at the bottom of the first trench. The junction field plate improves
(Continued)

an effect on reducing surface resistance. At the same time, a depth of trenches in the DMOS device may be reduced, and thereby a depth-to-width ratio of the device is reduced, improving the feasibility of increasing a voltage resistance level. Both the source region and the drain region in the DMOS device are led out on a same surface. A second doped polycrystalline silicon layer includes a first doped sublayer and a second doped sublayer with different conduction types.

20 Claims, 7 Drawing Sheets

(51) Int. Cl.
| | |
|---|---|
| *H10D 62/10* | (2025.01) |
| *H10D 64/23* | (2025.01) |
| *H10P 32/10* | (2026.01) |
| *H10P 32/14* | (2026.01) |

(52) U.S. Cl.
CPC .......... *H10D 64/252* (2025.01); *H10P 32/14* (2026.01); *H10P 32/171* (2026.01)

(56) References Cited

U.S. PATENT DOCUMENTS

| | | | | |
|---|---|---|---|---|
| 6,316,807 B1* | 11/2001 | Fujishima | .............. | H10D 30/63 257/E29.267 |
| 7,005,352 B2 | 2/2006 | Fujishima et al. | | |
| 8,716,794 B2* | 5/2014 | Luo | ...................... | H10D 62/116 257/343 |
| 8,748,976 B1* | 6/2014 | Kocon | ............... | H10D 30/0297 257/330 |
| 9,818,859 B2* | 11/2017 | Chen | .................. | H10D 30/0297 |
| 2001/0036704 A1* | 11/2001 | Hueting | ............... | H10D 62/115 438/270 |
| 2003/0132460 A1* | 7/2003 | Tabuchi | ............... | H10D 84/856 257/E21.643 |
| 2006/0131647 A1* | 6/2006 | Meyer | .................. | H10D 30/663 257/E29.257 |
| 2007/0166925 A1* | 7/2007 | Takeda | ................. | H10D 30/663 257/E27.06 |
| 2008/0035987 A1* | 2/2008 | Hebert | .................. | H10P 30/222 257/330 |
| 2010/0244125 A1* | 9/2010 | Sonsky | ................ | H10D 64/117 438/270 |
| 2011/0233659 A1* | 9/2011 | Tai | ...................... | H10D 30/0297 438/270 |
| 2014/0015045 A1* | 1/2014 | Su | ....................... | H10D 30/0297 257/334 |
| 2014/0361362 A1* | 12/2014 | Hsu | ...................... | H10D 30/664 438/270 |
| 2016/0204227 A1 | 7/2016 | Su et al. | | |
| 2016/0322489 A1* | 11/2016 | Siemieniec | .......... | H10D 30/664 |
| 2016/0343848 A1* | 11/2016 | Bartels | ................. | H10D 84/148 |
| 2019/0198644 A1* | 6/2019 | Bian | .................. | H10D 30/0297 |
| 2021/0151596 A1* | 5/2021 | Chuang | ................ | H10D 30/664 |

FOREIGN PATENT DOCUMENTS

| | | | | |
|---|---|---|---|---|
| DE | 10042226 B4 | 12/2014 | | |
| EP | 3499550 B1 * | 9/2021 | .......... | H10D 64/011 |
| JP | H07130996 A | 5/1995 | | |
| JP | 2006108514 A | 4/2006 | | |

OTHER PUBLICATIONS

ISA State Intellectual Property Office of the People's Republic of China, Written Opinion of the International Searching Authority Issued in Application No. PCT/CN2022/140340, Mar. 8, 2023, WIPO, 5 pages. (Submitted with Machine/ Partial Translation).

European Patent Office, Extended European Search Report Issued in Application No. 22914399.5, Jun. 18, 2025, Germany, 9 pages.

"Sugi A et al: ""A 30V Class Extremely Low On-Resistance Meshed Trench Lateral Powermosfet"", New York, IEEE, US, Jun. 4, 2002 , pp. 297-300."

\* cited by examiner

DMOS DEVICE HAVING JUNCTION FIELD PLATE AND MANUFACTURING METHOD THEREFOR

CROSS-REFERENCE TO RELATED APPLICATIONS

This application is a national stage of international PCT Application No. PCT/CN2022/140340 filed on Dec. 20, 2022, which claims priority to Chinese patent application No. 2021116820195 entitled "DMOS device having junction field plate and manufacturing method therefor" and filed with the Chinese Patent Office on Dec. 31, 2021, entire contents of which are incorporated herein by reference.

TECHNICAL FIELD

The present disclosure relates to the field of semiconductor device technologies, and in particular, to a DMOS device with a junction field plate and its manufacturing method.

BACKGROUND

Double-diffused Metal-Oxide-Semiconductor (DMOS) devices are typical and widely applied high-voltage power semiconductor devices. By adding a lightly doped drift region between source and drain in a DMOS device, the majority of voltage falls in the lightly doped drift region, so that the voltage resistance capability of the device is improved and the device may be used as a power MOS device in an integrated circuit. According to different structures, the DMOS devices may be divided into two types: Lateral (horizontal) DMOS (LDMOS) devices and Vertical (longitudinal) DMOS (VDMOS) devices.

The LDMOS devices are Radio Frequency (RF) power devices with great market demand and broad development prospects. In the field of RF wireless communication, silicon-based LDMOS devices are used in almost all base stations and long-range transmitters. In addition, the LDMOS devices are widely applied to RF amplifiers in High Frequency (HF), Very High Frequency (VHF), and Ultra High Frequency (UHF) communication systems, pulse radar, industrial, scientific and medical applications, avionics, and other fields. Since the LDMOS devices have advantages of high gain, high linearity, high voltage resistance, high output power, easy compatibility with a Complementary Metal Oxide Semiconductor (CMOS) technology, etc., the silicon-based LDMOS devices have become a new hotspot in RF semiconductor power devices.

The key to an LDMOS device is to achieve high Breakdown Voltage (BV, which is also referred to as voltage resistance) and low Specific on-Resistance (Rdson). In prior art, the high BV may be achieved only by increasing a size of the drift region, which increases chip area and cost of the LDMOS device. More seriously, a relationship between Rdson and BV of the device may be expressed as $Rdson \propto BV^{2.5}$. That is, increasing the size of the drift region will increase Rdson, which leads to a sharp increase in power consumption, followed by a decrease in device switching speed.

Therefore, how to alleviate contradiction between voltage resistance and Rdson, effectively improve voltage resistance or decrease Rdson has become a difficult problem for those skilled in the art to solve urgently.

SUMMARY

A purpose of the present disclosure is to provide a DMOS device with a junction field plate and its manufacturing method, so as to solve the problem that DMOS devices cannot effectively improve voltage resistance or decrease Rdson in prior art.

In order to solve the problem, the present disclosure provides a method for manufacturing a DMOS device with a junction field plate. The method for manufacturing the DMOS device with the junction field plate includes:

providing a semiconductor substrate, in which a first trench is formed;

forming a first doped polycrystalline silicon layer with a first conduction type on the semiconductor substrate, where the first doped polycrystalline silicon layer covers a surface of the semiconductor substrate and a surface of the first trench;

performing a first doping process and a second doping process on the first doped polycrystalline silicon layer to form a second doped polycrystalline silicon layer on the surface of the semiconductor substrate and a portion of a bottom surface of the first trench, where the second doped polycrystalline silicon layer includes a first doped sublayer with a second conduction type and a second doped sublayer with a first conduction type located on the first doped sublayer;

performing a heat treatment process, so that the second doped polycrystalline silicon layer in the first trench extends toward side surfaces of the first trench;

removing a portion of the second doped polycrystalline silicon layer to expose a portion of the bottom surface of the first trench;

forming a body region at a bottom of the first trench and forming a source region located in the body region;

performing a third doping process to form a drain region on the surface of the semiconductor substrate and a third doped sublayer with a second conduction type on a surface of the first doped polycrystalline silicon layer, where the second doped polycrystalline silicon layer, the first doped polycrystalline silicon layer, and the third doped sublayer on the side surfaces of the first trench serve as the junction field plate, and the first doped sublayer on the side surfaces of the first trench serves as a gate electrode; and forming a first lead-out structure electrically connected to the source region, a second lead-out structure electrically connected to the drain region and the third doped sublayer, and a third lead-out structure electrically connected to the gate electrode.

Optionally, in the method for manufacturing the DMOS device with the junction field plate, providing the semiconductor substrate, in which the first trench is formed, includes: forming a second trench in communication with the first trench in the semiconductor substrate;

forming the first doped polycrystalline silicon layer with the first conduction type on the semiconductor substrate, where the first doped polycrystalline silicon layer covers the surface of the semiconductor substrate and the surface of the first trench, includes: the first doped polycrystalline silicon layer covers a surface of the second trench;

performing the first doping process and the second doping process on the first doped polycrystalline silicon layer to form the second doped polycrystalline silicon layer on the surface of the semiconductor substrate and the portion of the bottom surface of the first trench, where the second doped polycrystalline silicon layer includes the first doped sublayer with the second conduction type and the second doped sublayer with the first conduction type located on the first doped sublayer, includes: forming the second doped polycrystalline silicon layer on a portion of a bottom surface of the second trench;

performing the heat treatment process, so that the second doped polycrystalline silicon layer in the first trench extends toward the side surfaces of the first trench, includes: so that the second doped polycrystalline silicon layer in the second trench extends toward side surfaces of the second trench;

after forming the body region and the source region located in the body region at the bottom of the first trench, and before performing the third doping process to form the drain region on the surface of the semiconductor substrate and the third doped sublayer with the second conduction type on the surface of the first doped polycrystalline silicon layer, where the second doped polycrystalline silicon layer, the first doped polycrystalline silicon layer, and the third doped sublayer on the side surfaces of the first trench serve as the junction field plate, and the first doped sublayer on the side surfaces of the first trench serves as the gate electrode, the method further includes: removing the first doped polycrystalline silicon layer on the side surfaces of the second trench, where the second doped polycrystalline silicon layer in the second trench serves as a gate lead-out layer, and the gate lead-out layer is connected to the gate electrode; and forming the first lead-out structure electrically connected to the source region, the second lead-out structure electrically connected to the drain region and the third doped sublayer, and the third lead-out structure electrically connected to the gate electrode includes: the third lead-out structure is connected to the gate lead-out layer to achieve electrical connection with the gate electrode.

Optionally, in the method for manufacturing the DMOS device with the junction field plate, the first conduction type is of a P-type, and the second conduction type is of an N-type; forming the first doped polycrystalline silicon layer with the first conduction type on the semiconductor substrate includes:

forming a polycrystalline silicon layer on the semiconductor substrate; and performing a P-type doping process on the polycrystalline silicon layer to form the first doped polycrystalline silicon layer, where a doping concentration for the first doped polycrystalline silicon layer is from 4E14 atom/cm$^{-3}$ to 1E16 atom/cm$^{-3}$, and a thickness of the first doped polycrystalline silicon layer is from 0.15 μm to 0.35 μm.

Optionally, in the method for manufacturing the DMOS device with the junction field plate, the first conduction type is of a P-type, and the second conduction type is of an N-type; performing the first doping process and the second doping process on the first doped polycrystalline silicon layer includes:

doping phosphonium ions, with a doping concentration from 1E17 atom/cm$^{-3}$ to 1E18 atom/cm$^{-3}$, in the first doping process; and doping indium ions, with a doping concentration from 1E20 atom/cm$^{-3}$ to 1E21 atom/cm$^{-3}$, in the second doping process.

Optionally, in the method for manufacturing the DMOS device with the junction field plate, performing the heat treatment process, so that the second doped polycrystalline silicon layer in the first trench extends toward the side surfaces of the first trench, further includes:

a diffusion speed of doping ions in the first doping process being faster than that in the second doping process, so that an extension length of the first doped sublayer in the first trench toward the side surfaces of the first trench is greater than that of the second doped sublayer in the first trench toward the side surfaces of the first trench, and an extension length of the first doped sublayer in the second trench toward the side surfaces of the second trench is greater than that of the second doped sublayer in the second trench toward the side surfaces of the second trench.

Optionally, in the method for manufacturing the DMOS device with the junction field plate, performing the heat treatment process, so that the second doped polycrystalline silicon layer in the first trench extends toward the side surfaces of the first trench, further includes:

the second doped polycrystalline silicon layer on the surface of the semiconductor substrate covers a portion of the side surfaces of the first trench and a portion of the side surfaces of the second trench.

Optionally, in the method for manufacturing the DMOS device with the junction field plate, removing the portion of the second doped polycrystalline silicon layer to expose the portion of the bottom surface of the first trench includes:

forming a first patterned photoresist layer, where the first patterned photoresist layer fills the second trench and extends to cover a portion of the second doped polycrystalline silicon layer on the semiconductor substrate, and another portion of the second doped polycrystalline silicon layer in the first trench and on the semiconductor substrate is exposed; and performing an etching process on a portion of the second doped polycrystalline silicon layer in the first trench and the exposed second doped polycrystalline silicon layer on the semiconductor substrate to remove the portion of the second doped polycrystalline silicon layer in the first trench and the exposed second doped polycrystalline silicon layer on the semiconductor substrate.

Optionally, in the method for manufacturing the DMOS device with the junction field plate, the first conduction type is of a P-type, and the second conduction type is of an N-type; forming the body region and the source region located in the body region at the bottom of the first trench includes:

performing a P-type doping process on the semiconductor substrate at the bottom of the first trench to form the body region in the semiconductor substrate at the bottom of the first trench; and performing an N-type doping process on a portion of the body region to form the source region in the body region.

Optionally, in the method for manufacturing the DMOS device with the junction field plate, removing the first doped polycrystalline silicon layer on the side surfaces of the second trench, where the second doped polycrystalline silicon layer in the second trench serves as the gate lead-out layer, and the gate lead-out layer is connected to the gate electrode, includes:

filling a hard mask layer in the first trench and the second trench, where the hard mask layer extends to cover the second doped polycrystalline silicon layer on the surface of the semiconductor substrate;

removing a portion of the hard mask layer by using a wet or dry etching process to expose the second doped polycrystalline silicon layer on the surface of the semiconductor substrate;

removing the second doped polycrystalline silicon layer on the surface of the semiconductor substrate by using a dry etching process;

forming a second patterned photoresist layer, where the second patterned photoresist layer covers the hard mask layer in the first trench and the first doped polycrystalline silicon layer; and removing the first doped polycrystalline silicon layer on the side surfaces of the second trench by using a dry etching process.

The present disclosure further provides a DMOS device with a junction field plate. The DMOS device with the junction field plate includes:

a semiconductor substrate, in which a first trench is formed;

a first doped polycrystalline silicon layer and a second doped polycrystalline silicon layer formed on side walls of the first trench, where the second doped polycrystalline silicon layer is closer to a bottom of the first trench than the first doped polycrystalline silicon layer, and the second doped polycrystalline silicon layer includes a first doped sublayer and a second doped sublayer located on the first doped sublayer;

a third doped sublayer formed on the side walls of the first trench, where the third doped sublayer is closer to a top of the first trench than the first doped polycrystalline silicon layer, the first doped sublayer in the first trench serves as a gate electrode, and the first doped polycrystalline silicon layer, the second doped polycrystalline silicon layer, and the third doped sublayer in the first trench serve as the junction field plate, where the first doped polycrystalline silicon layer is of a first conduction type, the first doped sublayer is of a second conduction type, the second doped sublayer is of the first conduction type, and the third doped sublayer is of the second conduction type;

a body region in the semiconductor substrate formed at the bottom of the first trench and a source region located in the body region;

a drain region formed on a surface of the semiconductor substrate; and a first lead-out structure electrically connected to the source region, a second lead-out structure electrically connected to the drain region and the third doped sublayer, and a third lead-out structure electrically connected to the gate electrode.

Optionally, in the DMOS device with the junction field plate, a second trench in communication with the first trench is further formed in the semiconductor substrate, the second doped polycrystalline silicon layer covers a bottom surface of the second trench, the second doped polycrystalline silicon layer in the second trench serves as a gate lead-out layer, the gate lead-out layer is connected to the gate electrode, and the third lead-out structure is connected to the gate lead-out layer to achieve electrical connection with the gate electrode.

Optionally, in the DMOS device with the junction field plate, in the first trench, in a direction from the bottom of the first trench to a trench opening of the first trench, the second doped polycrystalline silicon layer, the first doped polycrystalline silicon layer, and the third doped sublayer are sequentially in adjacent contact and cover side surfaces of the first trench.

Optionally, in the DMOS device with the junction field plate, the second doped sublayer is located in the first doped sublayer, and in the first trench, a bottom surface of the first doped polycrystalline silicon layer is connected to the first doped sublayer and the second doped sublayer.

Optionally, in the DMOS device with the junction field plate, in a first direction, the second trench is in communication with the first trench; in a second direction, the second trench is separated from the first trench, where the first direction is perpendicular to the second direction.

Optionally, in the DMOS device with the junction field plate, the body region surrounds the bottom of the first trench.

In a DMOS device with a junction field plate and its manufacturing method provided in the present disclosure, a drain region is located on a surface of a semiconductor substrate. A source region is located in the semiconductor substrate at a bottom of a first trench. A gate electrode is located at the bottom of the first trench. Therefore, lateral voltage resistance relative to LDMOS is changed to longitudinal voltage resistance, which may reduce a size of the entire device, decrease Rdson, and greatly optimize a contradiction relationship between voltage resistance and Rdson. Further, a junction field plate structure is formed in the DMOS device, which improves an effect on reducing surface resistance (Resurf). At the same time, due to the existence of the junction field plate structure, a depth of trenches in the DMOS device may be reduced, and thereby a depth-to-width ratio of the device is reduced, improving the feasibility of increasing a voltage resistance level. Furthermore, both the source region and the drain region in the DMOS device are led out on a same surface, which may be compatible with a technology for manufacturing a CMOS device. In addition, a second doped polycrystalline silicon layer includes a first doped sublayer and a second doped sublayer located on the first doped sublayer. The first doped sublayer and the second doped sublayer are of different conduction types. Therefore, in a case of an N-type gate electrode, a P-type doped layer may be directly connected to a potential of the gate electrode, which improves an effect of the junction field plate.

Figure 1:
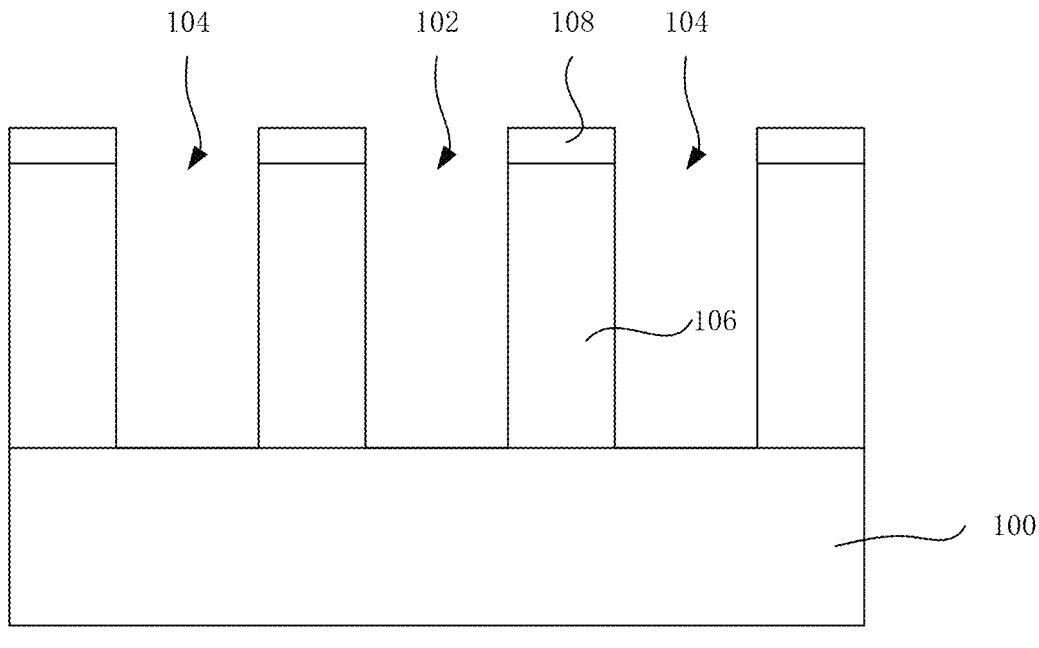
FIGS. 1 to 11 are structural schematic diagrams illustrating components formed in executing a method for manufacturing a DMOS device with a junction field plate according to an embodiment of the present disclosure.

where, reference signs are described as follows:

100—semiconductor substrate; 102—first trench; 104—second trench; 106—drift region; 108—first hard mask layer; 110—first doped polycrystalline silicon layer; 112—second doped polycrystalline silicon layer; 114a—first doped sublayer; 114b—second doped sublayer; 116—first patterned photoresist layer; 118—body region; 120—source region; 122a—gate electrode; 122b—gate lead-out layer; 124—second hard mask layer; 126—second patterned photoresist layer; 128—drain region; 130—third doped sublayer; 132—junction field plate; 134—first lead-out structure; 136—second lead-out structure; 138—third lead-out structure; 140—second dielectric layer.

DETAILED DESCRIPTION OF THE EMBODIMENTS

In order to make the purpose, advantages, and features of the present disclosure more clear, the DMOS device with the junction field plate and its manufacturing method provided in the present disclosure will be described in detail below with reference to the accompanying drawings and specific embodiments. According to the following description, the advantages and features of the present disclosure will be more clearly.

It should be noted that the accompanying drawings are made in a very simplified form and an inaccurate proportion only to conveniently and clearly help to illustrate the purpose of the embodiments of the present disclosure. In addition, a structure shown in a drawing is often a portion of an actual structure. Specifically, focuses that need to be shown in the drawings are different, and sometimes different proportions are used.

In addition, in the terms of the present disclosure, terms "first", "second", etc. serve only to distinguish structures/steps from each other, but do not indicate a sequential relationship between these structures/steps.

A core idea of the present disclosure is to provide a DMOS device with a junction field plate and its manufacturing method. A drain region is located on a surface of a semiconductor substrate. A source region is located in the semiconductor substrate at a bottom of a first trench. A gate electrode is located at the bottom of the first trench. Therefore, lateral voltage resistance relative to LDMOS is changed to longitudinal voltage resistance, which may reduce a size of the entire device, decrease Rdson, and greatly optimize a contradiction relationship between voltage resistance and Rdson. Further, a junction field plate structure is formed in the DMOS device, which improves an effect on reducing surface resistance (Resurf). At the same time, due to the existence of the junction field plate structure, a depth of trenches in the DMOS device may be reduced, and thereby a depth-to-width ratio of the device is reduced, improving the feasibility of increasing a voltage resistance level. Furthermore, both the source region and the drain region in the DMOS device are led out on a same surface, which may be compatible with a technology for manufacturing a CMOS device. In addition, a second doped polycrystalline silicon layer includes a first doped sublayer and a second doped sublayer located on the first doped sublayer. The first doped sublayer and the second doped sublayer are of different conduction types. Therefore, in a case of an N-type gate electrode, a P-type doped layer may be directly connected to a potential of the gate electrode, which improves an effect of the junction field plate.

In the DMOS device with the junction field plate and its manufacturing method according to the present application, the DMOS device may be either an N-type DMOS device or a P-type DMOS device. In the specific embodiments of the present application, the N-type DMOS device is taken as an example for detailed description. Based on the detailed description of the N-type DMOS device, those skilled in the art may obtain the P-type DMOS device and its manufacturing method accordingly, which will not be repeated here.

FIGS. 1 to 12 are structural schematic diagrams illustrating components formed in executing a method for manufacturing a DMOS device with a junction field plate according to an embodiment of the present disclosure.

As shown in FIG. 1, in the embodiments of the present application, first, a semiconductor substrate 100 is provided, and a first trench 102 and a second trench 104 are formed in the semiconductor substrate 100. Specifically, first, the semiconductor substrate 100 is provided, and then a doping process is performed on the semiconductor substrate 100 to form a drift region 106 in the semiconductor substrate 100, where the drift region 106 may be formed by using any one known technology. In the embodiments of the present application, next, a first hard mask layer 108 is formed on a surface of the semiconductor substrate 100, and the first hard mask layer 108 may be specifically of a multi-layer structure. For example, the first hard mask layer 108 may be of a multi-layer structure with three layers of ONO (oxide-SIN-oxide). The first hard mask layer 108 undergoes a patterning process to expose a portion of the surface of the semiconductor substrate 100. Subsequently, an etching process may be performed on the exposed semiconductor substrate 100 to form the first trench 102 and the second trench 104. The first trench 102 and the second trench 104 are respectively located on two sides of the drift region 106. That is, the drift region 106 is formed in the semiconductor substrate 100 between the first trench 102 and the second trench 104. Further, a first dielectric layer (not shown in FIG. 1) is formed on the semiconductor substrate 100, and the first dielectric layer covers surfaces of the semiconductor substrate 100, the first trench 102, and the second trench 104. The first dielectric layer may be specifically an oxide layer, a nitride layer, or the like.

Figure 2:
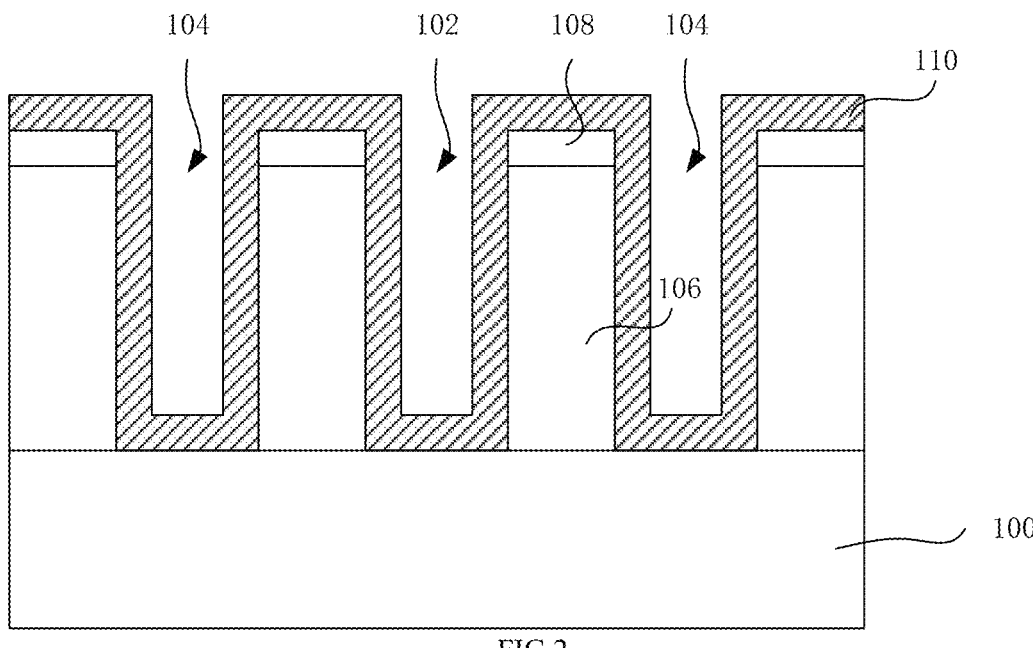

Next, referring to FIG. 2, a first doped polycrystalline silicon layer 110 is formed on the semiconductor substrate 100, and the first doped polycrystalline silicon layer 110 covers the surface of the semiconductor substrate 100, the surface of the first trench 102, and the surface of the second trench 104. Specifically, in the embodiments of the present application, the first doped polycrystalline silicon layer 110 covers an upper surface of the first hard mask layer 108, side surfaces and a bottom surface of the first trench 102, and side surfaces and a bottom surface of the second trench 104. In the embodiments of the present application, the first doped polycrystalline silicon layer 110 covers the first dielectric layer.

Preferably, a thickness of the first doped polycrystalline silicon layer 110 is from 0.15 μm to 0.35 μm. For example, the thickness of the first doped polycrystalline silicon layer 110 may be 0.18 μm, 0.20 μm, 0.25 μm, 0.27 μm or 0.33 μm.

In the embodiments of the present application, the first doped polycrystalline silicon layer 110 may be specifically formed in the following manners: forming a polycrystalline silicon layer (not shown in FIG. 2) on the semiconductor substrate 100, and performing a P-type doping process on the polycrystalline silicon layer to form the first doped polycrystalline silicon layer 110. Preferably, a doping concentration for the first doped polycrystalline silicon layer is from 4E14 atom/cm$^{-3}$ to 1E16 atom/cm$^{-3}$. For example, the doping concentration for the first doped polycrystalline silicon layer may be 8E14 atom/cm$^{-3}$, 1E15 atom/cm$^{-3}$, 5E15 atom/cm$^{-3}$ or 9E15 atom/cm$^{-3}$. Doping ions may be, for example, boron (B).

Figure 3:
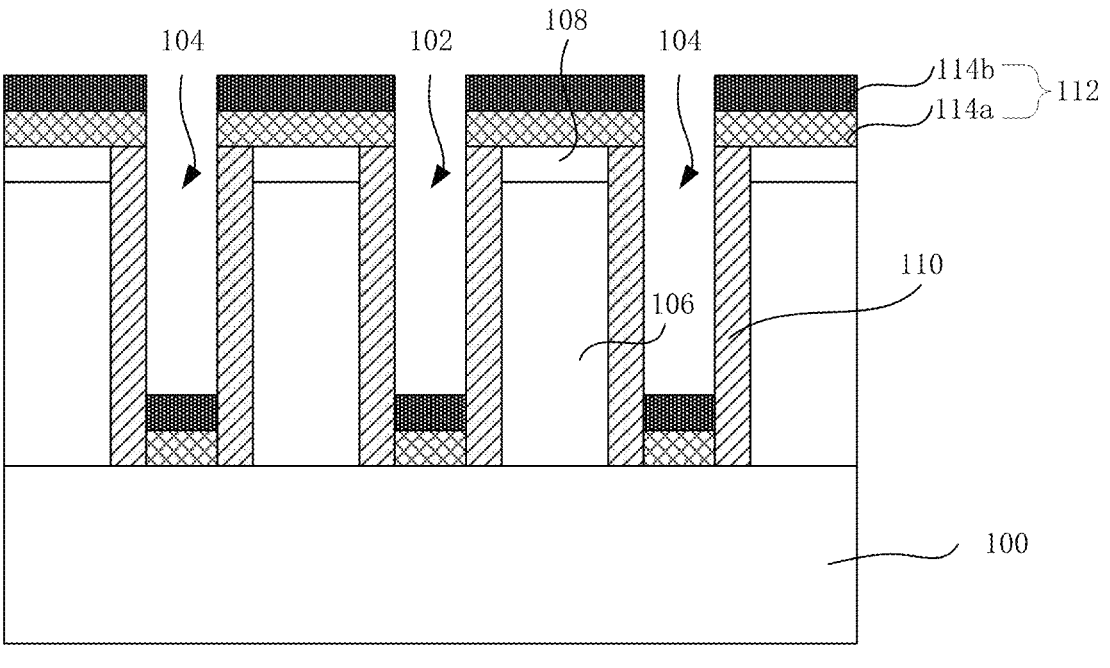

Next, as shown in FIG. 3, an N-type doping process and a P-type doping process are performed on the first doped polycrystalline silicon layer 110 to form a second doped polycrystalline silicon layer 112 on the surface of the semiconductor substrate 100, a portion of the bottom surface of the first trench 102, and a portion of the bottom surface of the second trench 104. The second doped polycrystalline silicon layer 112 includes a first doped sublayer 114a and a second doped sublayer 114b located on the first doped sublayer 114a. Correspondingly, the first doped sublayer 114a is of an N-type, and the second doped sublayer 114b is of a P-type. Further, compared to the first doped polycrystalline silicon layer 110, the second doped sublayer 114b is heavily doped. That is, the first doped polycrystalline silicon layer 110 is a lightly doped P-type conduction layer, and the second doped sublayer 114b is a heavily doped P-type conduction layer. In the embodiments of the present application, a doping process may be performed on the entire semiconductor substrate 100 by using a universal injection technology, which may reduce process cost. The first doped polycrystalline silicon layer 110 located at a bottom of the first trench 102 and covering the side surfaces of the first trench 102, and the first doped polycrystalline silicon layer 110 located at a bottom of the second trench 104 and covering the side surfaces of the second trench 104, due to a blocking effect of the first doped polycrystalline silicon layer 110 thereon, in performing the N-type doping process and the P-type doping process on the first doped polycrystalline silicon layer 110, are usually maintained as the first doped polycrystalline silicon layer 110.

Preferably, N-type doping ions are phosphonium ions, with a doping concentration from 1E17 atom/cm$^{-3}$ to 1E18 atom/cm$^{-3}$. For example, the doping concentration of the N-type doping ions is 2E17 atom/cm$^{-3}$, 4E17 atom/cm$^{-3}$, 5E17 atom/cm$^{-3}$, or 7E17 atom/cm$^{-3}$. P-type doping ions are indium ions, with a doping concentration from 1E20 atom/cm$^{-3}$ to 1E21 atom/cm$^{-3}$. For example, the doping concentration of the P-type doping ions is 2E20 atom/cm$^{-3}$, 3E20 atom/cm$^{-3}$, 5E20 atom/cm$^{-3}$, or 8E20 atom/cm$^{-3}$. That is, here, the heavily doped second doped sublayer 114b is formed.

Figure 4:
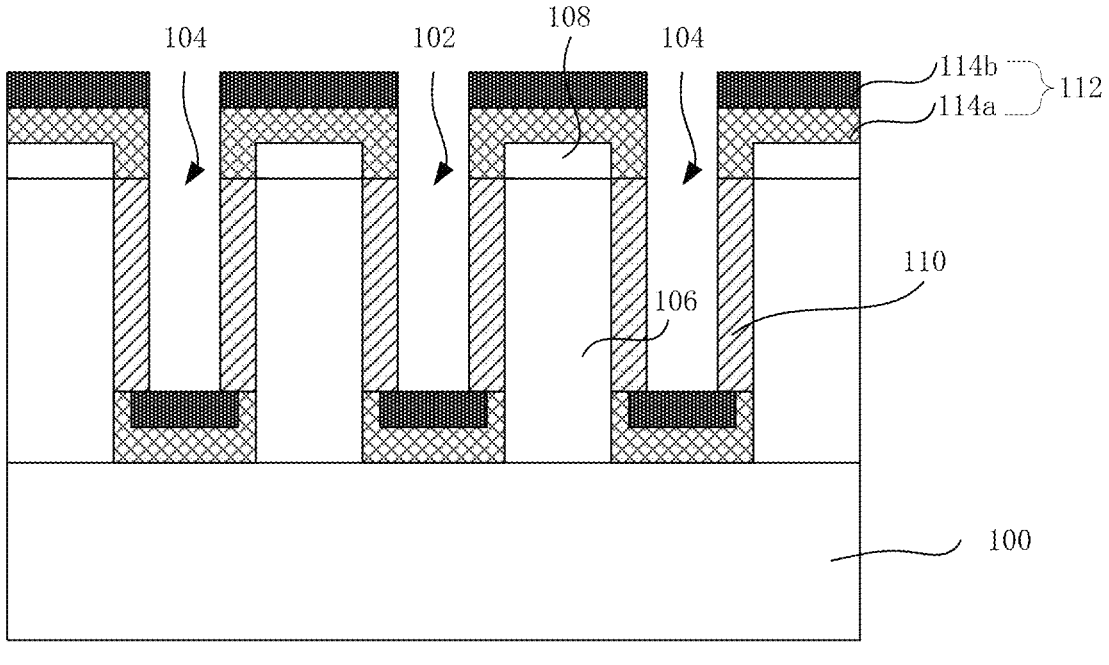

Next, as shown in FIG. 4, a heat treatment process is performed on the second doped polycrystalline silicon layer 112. Doping ions in the second doped polycrystalline silicon layer 112 on the bottom surface of the first trench 102 and the bottom surface of the second trench 104 diffuse into the first doped polycrystalline silicon layer 110, so that the second doped polycrystalline silicon layer 112 on the bottom surface of the first trench 102 extends toward the side surfaces of the first trench 102, and the second doped polycrystalline silicon layer 112 on the bottom surface of the second trench 104 extends toward the side surfaces of the second trench 104. In the embodiments of the present application, the heat treatment process is an annealing process. In other embodiments of the present application, the heat treatment process may be other high-temperature treatment process.

In the embodiments of the present application, a diffusion speed of the N-type doping ions is faster than that of the P-type doping ions, so that an extension length of the first doped sublayer 114a in the first trench 102 toward the side surfaces of the first trench 102 is greater than that of the second doped sublayer 114b in the first trench 102 toward the side surfaces of the first trench 102, and an extension length of the first doped sublayer 114a in the second trench 104 toward the side surfaces of the second trench 104 is greater than that of the second doped sublayer 114b in the second trench 104 toward the side surfaces of the second trench 104. In other embodiments of the present application, after the heat treatment process is performed, a bottom wall and side walls of the second doped sublayer 114b in the first trench 102 may be surrounded by the first doped sublayer 114a, and a bottom wall and side walls of the second doped sublayer 114b in the second trench 104 may be surrounded by the first doped sublayer 114a.

In the terms of the present application, the term "bottom wall" is equivalent to the term "bottom surface", and the term "side wall" is equivalent to the term "side surface". Because the term "surface" usually has only one expression, and the term "bottom wall" and the term "bottom surface" as well as the term "side wall" and the term "side surface" are often used in combination, such expressions continue to be used in the terms of the present application.

Further, the first doped sublayer 114a in the first trench 102 extends to the side surfaces of the first trench 102, so that the first doped sublayer 114a covers the entire bottom surface of the first trench 102; the second doped sublayer 114b in the first trench 102 extends toward the side surfaces of the first trench 102, but is not connected to/does not contact with the side surfaces of the first trench 102, so that the second doped sublayer 114b is located in the first doped sublayer 114a.

Correspondingly, in the embodiments of the present application, the first doped sublayer 114a in the second trench 104 extends to the side surfaces of the second trench 104, so that the first doped sublayer 114a covers the entire bottom surface of the second trench 104; the second doped sublayer 114b in the second trench 104 extends toward the side surfaces of the second trench 104, but is not connected to/does not contact with the side surfaces of the second trench 104, so that the second doped sublayer 114b is located in the first doped sublayer 114a.

Continuously referring to FIG. 4, in the embodiments of the present application, in performing the heat treatment process on the second doped polycrystalline silicon layer 112, doping ions in the second doped polycrystalline silicon layer 112 on the surface of the semiconductor substrate 100 (specifically, a surface of the first hard mask layer 108) diffuse into the first doped polycrystalline silicon layer 110, so that the second doped polycrystalline silicon layer 112 on the surface of the semiconductor substrate 100 extends toward the side surfaces of the first trench 102 and the side surfaces of the second trench 104, and covers a portion of the side surfaces of the first trench 102 and a portion of the side surfaces of the second trench 104. That is, the second doped polycrystalline silicon layer 112 on the surface of the semiconductor substrate 100 extends to cover a top (side surfaces) of the first trench 102 and a top (side surfaces) of the second trench 104.

Specifically, in the embodiments of the present application, the first doped sublayer 114a in the second doped polycrystalline silicon layer 112 covering an upper surface of the semiconductor substrate 100 extends toward the side surfaces of the first trench 102 and the side surfaces of the second trench 104, and covers a portion of the side surfaces of the first trench 102 near the top of the first trench 102 and a portion of the side surfaces of the second trench 104 near the top of the second trench 104.

Figure 5:
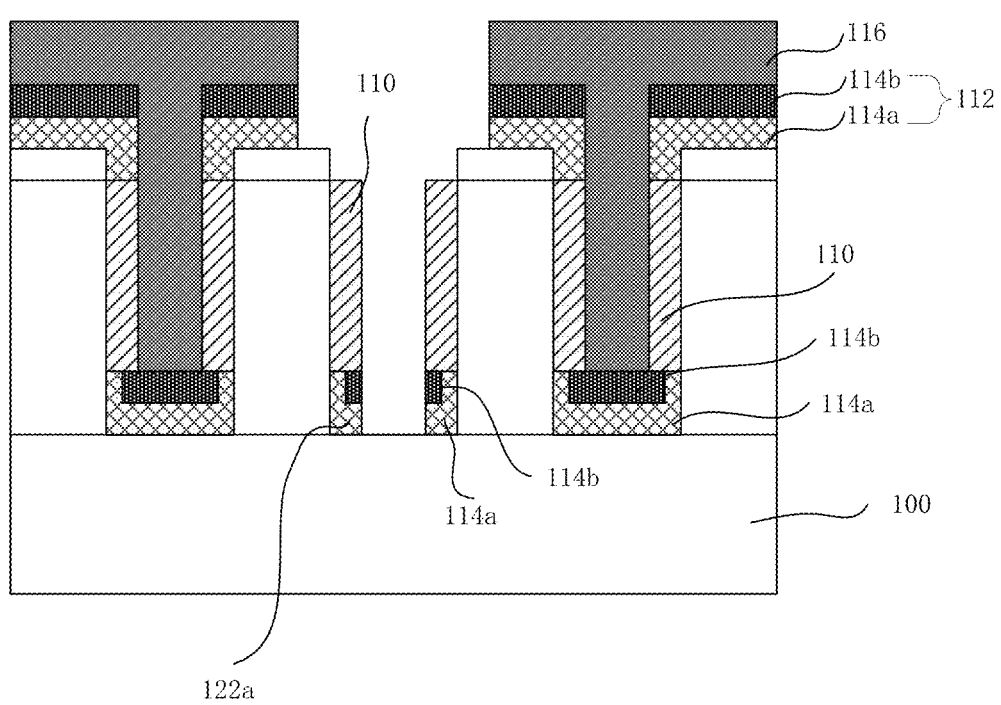

Next, as shown in FIG. 5, a portion of the second doped polycrystalline silicon layer 112 on the bottom surface of the first trench 102 is removed. The second doped polycrystalline silicon layer 112 on the bottom surface of the first trench 102 near the side surfaces of the first trench 102 is retained, where the retained (remaining) first doped sublayer 114a serves as a gate electrode 122a. In the embodiments of the present application, the gate electrode further includes the first dielectric layer (not shown in FIG. 5) between the retained (remaining) first doped sublayer 114a and the surface of the first trench 102.

It should be noted that, starting from FIG. 5, the first doped sublayer 114a in the first trench 102 serves as the gate electrode 122a. That is, if both the reference sign 114a and the reference sign 122a appear in the drawings, they may indicate a same structure; in addition, hereinafter, due to the need for expression, the first doped sublayer 114a in the first trench 102 and the gate electrode 122a may appear simultaneously, and both of them are necessary for achieving different explanations.

Continuously referring to FIG. 5, in the embodiments of the present application, removing a portion of the second doped polycrystalline silicon layer 112 on the bottom surface of the first trench 102 includes: forming a first patterned photoresist layer 116, where the first patterned photoresist layer 116 fills the second trench 104 and extends to cover a portion of the second doped polycrystalline silicon layer 112 on the semiconductor substrate 100 (i.e., a portion of the second doped polycrystalline silicon layer 112 near the second trench 104), and another portion of the second doped polycrystalline silicon layer 112 in the first trench 102 and on the semiconductor substrate 100 (i.e., a portion of the second doped polycrystalline silicon layer 112 near the first trench 102) is exposed; performing an etching process on the exposed second doped polycrystalline silicon layer 112 on the bottom surface of the first trench 102 (here, the second doped polycrystalline silicon layer 112 on the bottom surface of the first trench 102 near the side surfaces of the first trench 102, due to being covered with the first doped polycrystalline silicon layer 110 thereon (which may correspondingly refer to FIG. 5), is not exposed) and the exposed second doped polycrystalline silicon layer 112 on the semiconductor substrate 100 to remove a portion of the second doped polycrystalline silicon layer 112 on the bottom surface of the first trench 102 and a portion of the second doped polycrystalline silicon layer 112 on the semiconductor substrate 100.

Here, a portion of the second doped polycrystalline silicon layer 112 on the bottom surface of the first trench 102 and a portion of the second doped polycrystalline silicon layer 112 on the semiconductor substrate 100 may be removed by using a dry etching process, so as to expose the semiconductor substrate 100 at the bottom of the first trench 102 and an upper surface of the first doped polycrystalline silicon layer 110 in the first trench 102. In other embodiments of the present application, after the etching process is performed on the exposed second doped polycrystalline silicon layer 112 on the bottom surface of the first trench 102 and the exposed second doped polycrystalline silicon layer 112 on the semiconductor substrate 100, the first hard mask layer 108 at trench opening edges of the first trench 102, and the semiconductor substrate 100 on a portion of the bottom surface of the first trench 102 are exposed, and the first doped polycrystalline silicon layer 110 on the side surfaces of the first trench 102, and the second doped polycrystalline silicon layer 112 on the side surfaces of the first trench 102 are retained. The second doped polycrystalline silicon layer 112 on the side surfaces of the first trench 102 may be the second doped polycrystalline silicon layer 112 located on the side surfaces of the first trench 102 and on an upper portion and a lower portion of the first doped polycrystalline silicon layer 110 (the second doped polycrystalline silicon layer 112 located on the side surfaces of the first trench 102 and on the upper portion of the first doped polycrystalline silicon layer 110 is not shown in FIG. 5); the second doped polycrystalline silicon layer 112 on the side surfaces of the first trench 102 may be the second doped polycrystalline silicon layer 112 located on the side surfaces of the first trench 102 and only on the lower portion of the first doped polycrystalline silicon layer 110.

Figure 6:
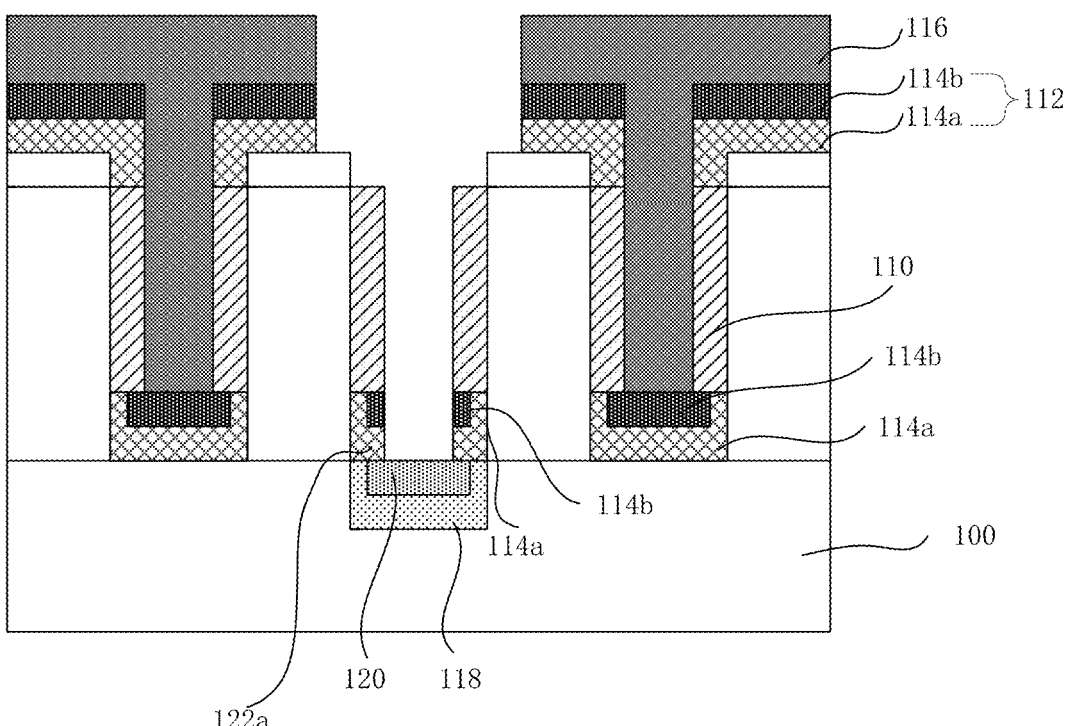

Next, as shown in FIG. 6, a body region 118 and a source region 120 located in the body region 118 are formed in the semiconductor substrate 100 at the bottom of the first trench 102. Specifically, first, a P-type doping process may be performed on the semiconductor substrate 100 at the bottom of the first trench 102 to form the body region 118 in the semiconductor substrate 100 at the bottom of the first trench 102. The body region 118 may be in adjacent contact only with the bottom surface of the first trench 102. The body region 118 may surround the bottom of the first trench 102. That is, the body region 118 is in adjacent contact with both the bottom surface of the first trench 102 and a portion of the side surfaces of the first trench 102. Next, an N-type doping process is performed on a portion of the body region 118 to form the source region 120 in the body region 118. In the embodiments of the present application, the first doped sublayer 114a is connected to the source region 120. That is, the source region 120 extends to directly below the first doped sublayer 114a, so as to be connected to the first doped sublayer 114a. While the N-type doping process is performed to form the source region 120, the upper surface of the first doped polycrystalline silicon layer 110 in the first trench 102 is doped with N-type ions. In the embodiments of the present application, after the body region 118 and the source region 120 are formed, the first patterned photoresist layer 116 is removed.

Figure 8:
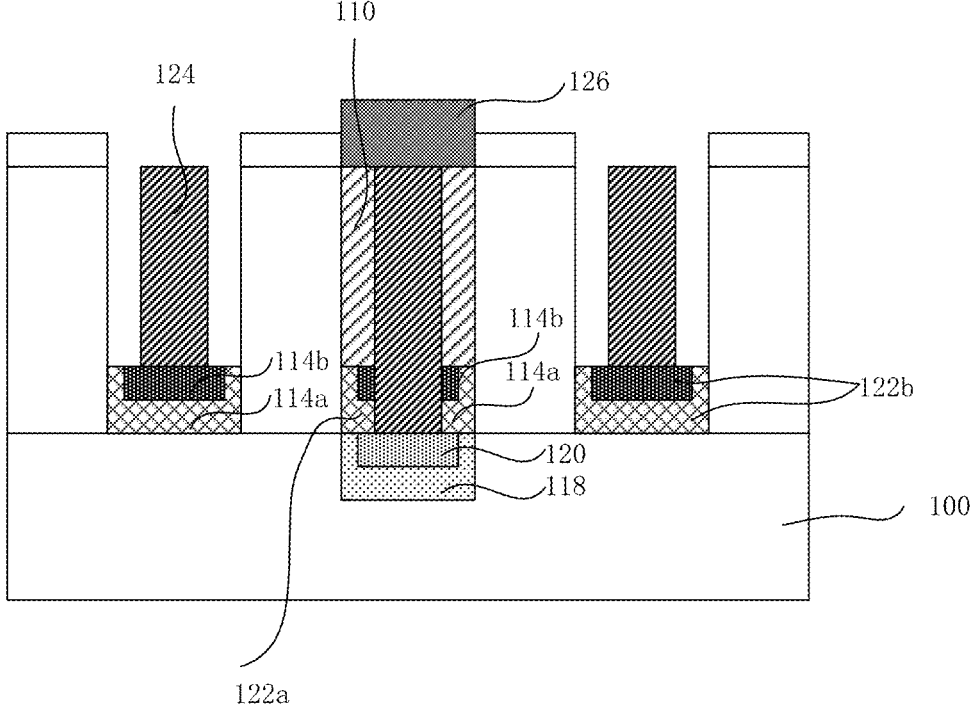

In the embodiments of the present application, next, as shown in FIG. 8, the first doped polycrystalline silicon layer 110 on the side surfaces of the second trench 104 is removed, and the second doped polycrystalline silicon layer 112 at the bottom of the second trench 104 serves as a gate lead-out layer 122b.

It should be noted that, starting from FIG. 8, the second doped polycrystalline silicon layer 112 in the second trench 104 serves as the gate lead-out layer 122b. That is, if both the reference sign 112 and the reference sign 122b appear in the drawings, they may indicate a same structure; in addition, hereinafter, due to the need for expression, the second doped polycrystalline silicon layer 112 in the second trench 104 and the gate lead-out layer 122b may appear simultaneously, and both of them are necessary for achieving different explanations.

Figure 7:
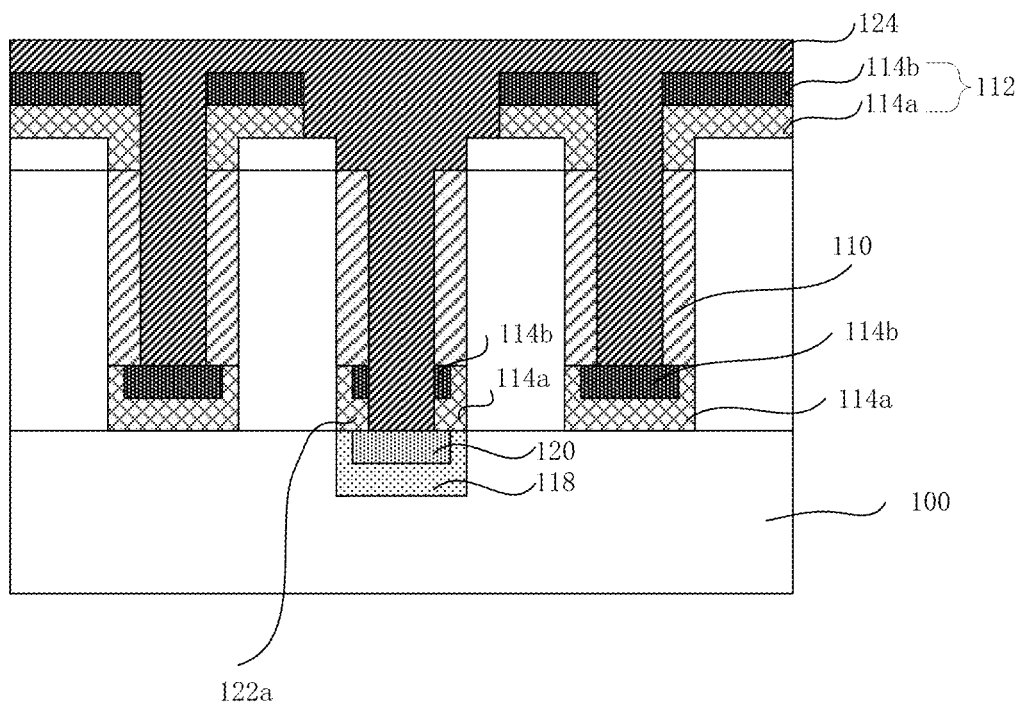

Specifically, first, as shown in FIG. 7, a second hard mask layer 124 (which is so called for distinguishing from the previous first hard mask layer 108) is filled in the first trench 102 and the second trench 104, and the second hard mask layer 124 extends to cover the second doped polycrystalline silicon layer 112 on the surface of the semiconductor substrate 100. Here, the second hard mask layer 124 have a multi-layer structure made of materials ONO. In the embodiments of the present application, in the process of removing a portion of the second doped polycrystalline silicon layer 112 on the bottom surface of the first trench 102, a portion of the second doped polycrystalline silicon layer 112 on the semiconductor substrate 100 is further removed, and a portion of the first hard mask layer 108 is exposed. Therefore, here, the second hard mask layer 124 further covers the exposed portion of the first hard mask layer 108.

Next, as shown in FIG. 8, a portion of the second hard mask layer 124 is removed by using a wet or dry etching process, so as to expose the second doped polycrystalline silicon layer 112 on the surface of the semiconductor substrate 100. That is, here, the second hard mask layer 124 on the surface of the semiconductor substrate 100 is removed, and the second hard mask layer 124 in the first trench 102 and the second trench 104 is retained, so as to expose the second doped polycrystalline silicon layer 112 on the surface of the semiconductor substrate 100.

Continuously referring to FIG. 8, next, the second doped polycrystalline silicon layer 112 on the surface of the semiconductor substrate 100 is removed by using a dry etching process. Here, the first hard mask layer 108 on the surface of the semiconductor substrate 100 is exposed. In the embodiments of the present application, after the second doped polycrystalline silicon layer 112 on the surface of the semiconductor substrate 100 is removed, the first doped polycrystalline silicon layer 110 in the second trench 104 and the second hard mask layer 124 in the second trench 104 are further exposed. In other embodiments of the present application, in a case where the second doped polycrystalline silicon layer 112 is retained on side walls of the first trench 102 and on the upper portion of the first doped polycrystalline silicon layer 110 in a structure shown in FIG. 5 obtained by performing the etching process, after the second doped polycrystalline silicon layer 112 on the surface of the semiconductor substrate 100 is removed by using a dry etching process, the second doped polycrystalline silicon layer 112 on the side surfaces of the first trench 102 and on the upper portion of the first doped polycrystalline silicon layer 110 (not shown in FIG. 8), and the second hard mask layer 124 in the first trench 102 are exposed.

Next, continuously referring to FIG. 8, a second patterned photoresist layer 126 is formed. The second patterned photoresist layer 126 covers the first trench 102, and the first hard mask layer 108 on the surface of the semiconductor substrate 100 and the second trench 104 are exposed. In the embodiments of the present application, the second patterned photoresist layer 126 covers the second hard mask layer 124 in the first trench 102 and the first doped polycrystalline silicon layer 110. In other embodiments of the present application, the second patterned photoresist layer 126 may cover the second hard mask layer 124 in the first trench 102, and the second doped polycrystalline silicon layer 112 on the side surfaces of the first trench 102 and on the upper portion of the first doped polycrystalline silicon layer 110. Next, the first doped polycrystalline silicon layer 110 on the side surfaces of the second trench 104 is removed by using a dry etching process, and the second doped polycrystalline silicon layer 112 at the bottom of the second trench 104 is retained. The second doped polycrystalline silicon layer 112 retained in the second trench 104 serves as the gate lead-out layer 122b. In the embodiments of the present application, after the gate lead-out layer 122b is formed, the second patterned photoresist layer 126 is removed.

In the embodiments of the present application, the gate lead-out layer 122b may facilitate the lead-out of the gate electrode 122a, simplifying the process and improving the quality and reliability of the DMOS device. In other embodiments of the present application, the gate lead-out layer 122b may not be manufactured, and accordingly, there is no need to form the second trench 104, and even no need to form the first doped polycrystalline silicon layer 110, the second doped polycrystalline silicon layer 112, etc. therein.

Figure 9:
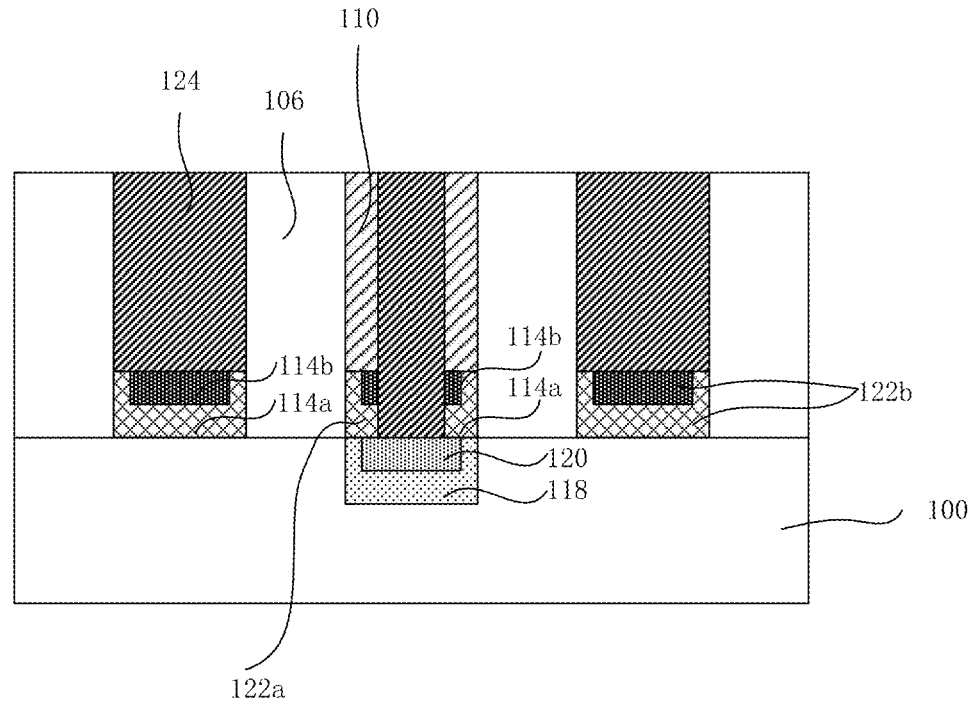

Referring to FIG. 9, in the embodiments of the present application, refilling the second hard mask layer 124 in the second trench 104 is further included, so as to fully fill the second trench 104. Next, a Chemical Mechanical Polishing (CMP) process is performed on the semiconductor substrate 100 to remove the second patterned photoresist layer 126, and the first hard mask layer 108 on the surface of the semiconductor substrate 100, exposing the semiconductor substrate 100 and the upper surface of the first doped polycrystalline silicon layer 110. In other embodiments of the present application, the semiconductor substrate 100, and the second doped polycrystalline silicon layer 112 on the upper portion of the first doped polycrystalline silicon layer 110 in the first trench 102 (the second doped polycrystalline silicon layer 112 on the side surfaces of the first trench 102 and on the upper portion of the first doped polycrystalline silicon layer 110 is not shown in FIG. 9) may be exposed. The second patterned photoresist layer 126 and the first hard mask layer 108 may be removed respectively by using two processes. For example, the second patterned photoresist layer 126 may be removed first by using a stripping process, and then the first hard mask layer 108 may be removed by using a CMP process.

Figure 10:
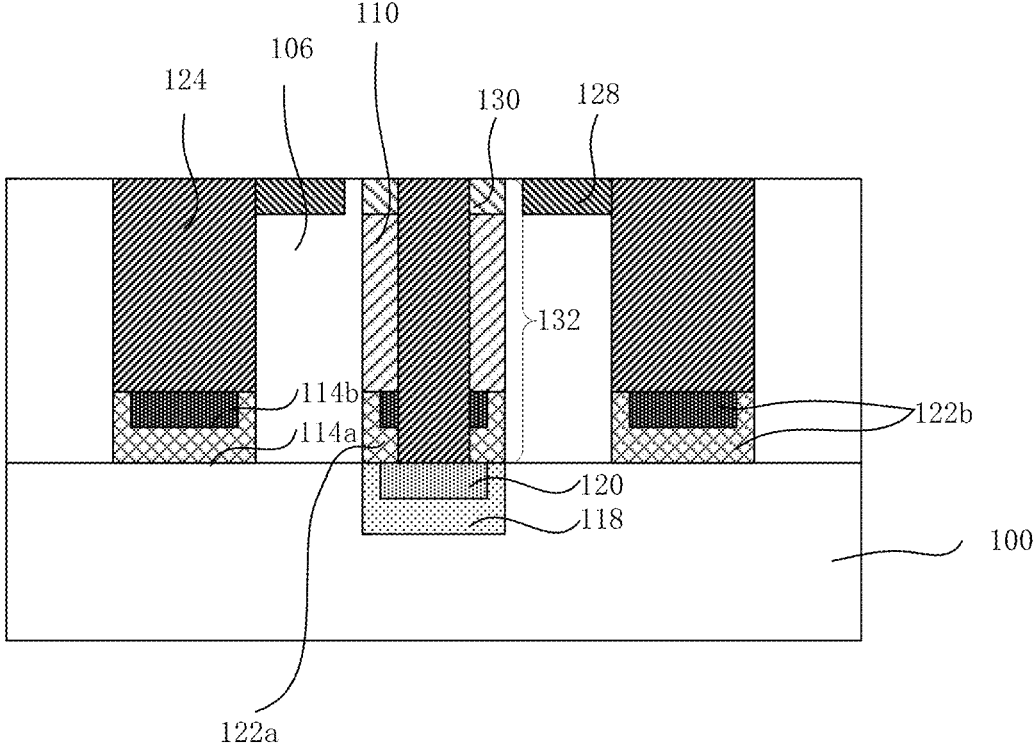

Next, referring to FIG. 10, a doping process is performed on the semiconductor substrate 100 and the first doped polycrystalline silicon layer 110 to form a drain region 128 on the surface of the semiconductor substrate 100 and a third doped sublayer 130 on a surface of the first doped polycrystalline silicon layer 110, forming a junction field plate 132 on the side surfaces of the first trench 102. That is, the first doped sublayer 114a on the side surfaces of the bottom of the first trench 102 serves as a device gate electrode, and in combination with the second doped sublayer 114b, the first doped polycrystalline silicon layer 110, and the third doped sublayer 130 on the side surfaces of the first trench 102, serve as the junction field plate 132. The drain region 128 is located in the semiconductor substrate 100 between the first trench 102 and the second trench 104.

Figure 11:
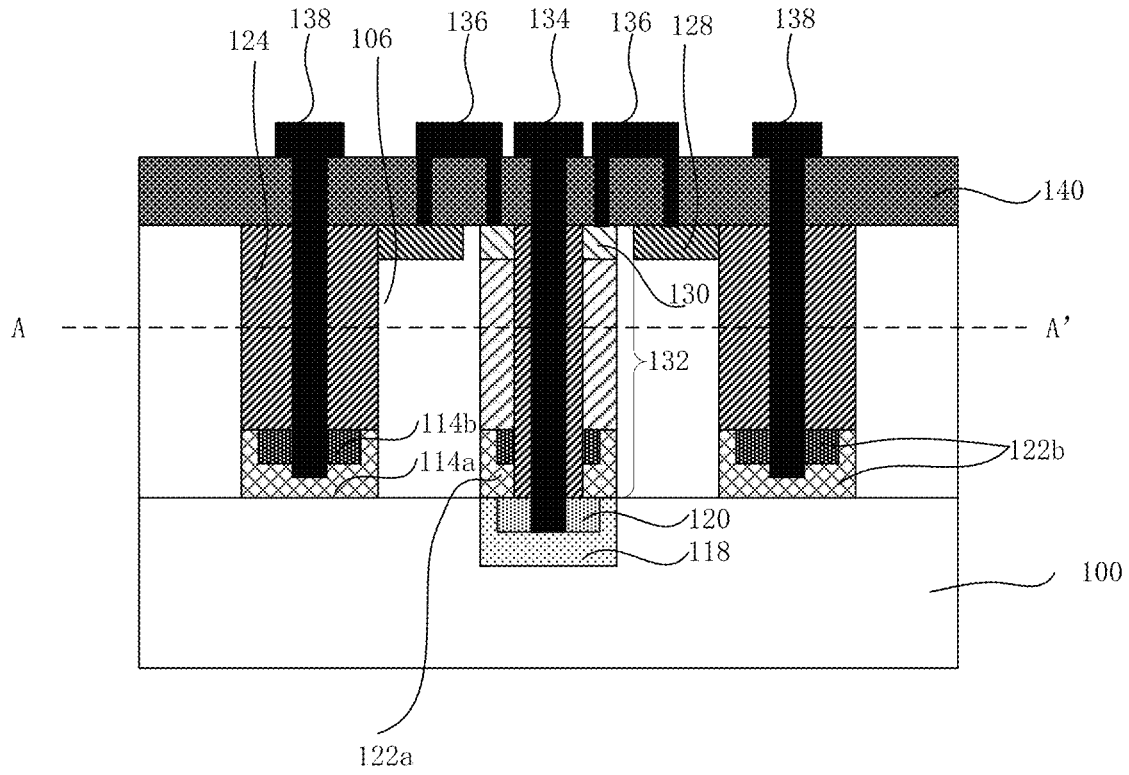

As shown in FIG. 11, next, a first lead-out structure 134 electrically connected to the source region 120, a second lead-out structure 136 electrically connected to the drain region 128, and a third lead-out structure 138 electrically connected to the gate lead-out layer 122b are formed, where the second lead-out structure 136 is further electrically connected to the third doped sublayer 130. In the embodiments of the present application, the third lead-out structure 138 is connected to the gate lead-out layer 122b to achieve electrical connection with the gate electrode 122a. Specifically, a second dielectric layer 140 may be formed, and the second dielectric layer 140 covers the semiconductor substrate 100 and the second hard mask layer 124; next, an etching process is performed on the second dielectric layer 140 and the second hard mask layer 124 to form a first opening exposing the source region 120 (not shown in FIG. 11), a second opening exposing the drain region 128 and the third doped sublayer 130 (not shown in FIG. 11), and a third opening exposing the gate lead-out layer 122b (not shown in FIG. 11); then, a conduction layer is filled in the first opening, the second opening, and the third opening to form the first lead-out structure 134, the second lead-out structure 136, and the third lead-out structure 138. Further, the first opening, the second opening, and the third opening may be formed in different etching steps. For example, the second opening may be formed in a shallow hole etching step, and the first opening and the third opening may be formed in a deep hole etching step.

Continuously referring to FIG. 11, correspondingly, in the embodiments of the present application, a DMOS device with a junction field plate is further provided. Specifically, the DMOS device with the junction field plate includes: a semiconductor substrate 100, in which a first trench 102 is formed; a first doped polycrystalline silicon layer 110 and a second doped polycrystalline silicon layer 112 formed on side walls of the first trench 102, where the second doped polycrystalline silicon layer 112 is closer to a bottom of the first trench 102 than the first doped polycrystalline silicon layer 110, and the second doped polycrystalline silicon layer 112 includes a first doped sublayer 114a and a second doped sublayer 114b located on the first doped sublayer 114a; a third doped sublayer 130 formed on the side walls of the first trench 102, where the third doped sublayer 130 is closer to a top of the first trench 102 than the first doped polycrystalline silicon layer 110, the first doped sublayer 114a in the first trench 102 serves as a gate electrode 122a, and the first doped polycrystalline silicon layer 110, the second doped polycrystalline silicon layer 112, and the third doped sublayer 130 in the first trench 102 form the junction field plate 132, where the first doped polycrystalline silicon layer 110 is of a P-type, the first doped sublayer 114a is of an N-type, the second doped sublayer 114b is of a P-type, and the third doped sublayer 130 is of an N-type; a body region 118 in the semiconductor substrate 100 formed at the bottom of the first trench 102 and a source region 120 located in the body region 118; a drain region 128 formed on a surface of the semiconductor substrate 100; and a first lead-out structure 134 electrically connected to the source region 120, a second lead-out structure 136 electrically connected to the drain region 128, and a third lead-out structure 138 electrically connected to the gate electrode 122a, where the second lead-out structure 136 is further electrically connected to the third doped sublayer 130.

In other embodiments of the present application, the second doped polycrystalline silicon layer 112, the first doped polycrystalline silicon layer 110, and the third doped sublayer 130, which are sequentially in adjacent contact and cover side surfaces of the first trench 102 in a direction from the bottom of the first trench 102 to a trench opening of the first trench 102, form the junction field plate 132.

Figure 12:
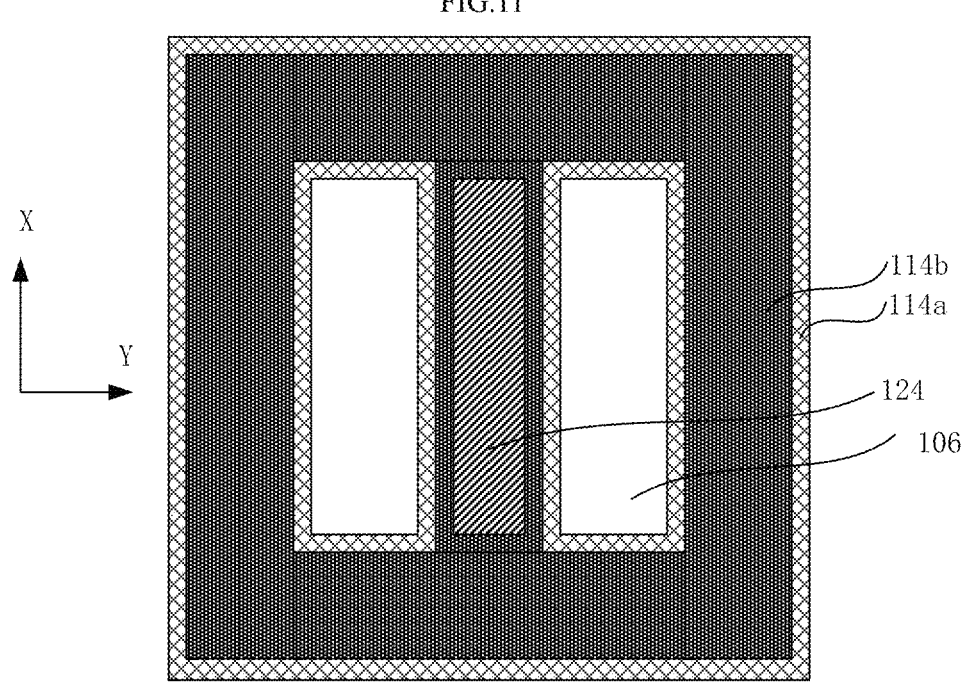
FIG. 12 is a top view illustrating a second doped polycrystalline silicon layer in the DMOS device with the junction field plate in FIG. 11.

In other embodiments of the present application, the DMOS device with the junction field plate further includes a second trench 104 in communication with the first trench 102. Correspondingly, FIG. 12 is a top view illustrating a section of the DMOS device with the junction field plate in FIG. 11 along a line AA'. As shown in FIG. 12, in the embodiments of the present application, in a first direction X, the second trench 104 is in communication with the first trench 102; in a second direction Y, the second trench 104 is separated from the first trench 102, where the first direction X is perpendicular to the second direction Y That is, the first trench 102 and the second trench 104 form a trench similar to a "目" shape. The second doped polycrystalline silicon layer 112 further covers a bottom surface of the second trench 104, and the second doped polycrystalline silicon layer 112 in the second trench 104 serves as a gate lead-out layer 122b. The gate lead-out layer 122b is connected to the gate electrode 122a, and the third lead-out structure 138 is directly connected to the gate lead-out layer 122b to achieve electrical connection with the gate electrode 122a.

In the embodiments of the present application, the second doped sublayer 114b is located in the first doped sublayer 114a, and in the first trench 102, a bottom surface of the first doped polycrystalline silicon layer 110 is connected to both the first doped sublayer 114a and the second doped sublayer 114b.

Further, the DMOS device with the junction field plate further includes: a drift region 106 formed in the semiconductor substrate 100 between the first trench 102 and the second trench 104. The drain region 128 is located in the semiconductor substrate 100 between the first trench 102 and the second trench 104. Furthermore, the drain region 128 is located in the drift region 106. Here, the first trench 102, the drift region 106, and the second trench 104 are arranged along the second direction Y.

Preferably, the first doped polycrystalline silicon layer 110 is a doped polycrystalline silicon layer, and a doping concentration therefor is from 4E14 atom/cm$^{-3}$ to 1E16 atom/cm$^{-3}$. A thickness of the first doped polycrystalline silicon layer 110 is from 0.15 μm to 0.35 μm. The first doped sublayer 114a is a doped polycrystalline silicon layer, and doping ions are phosphonium ions, with a doping concentration from 1E17 atom/cm$^{-3}$ to 1E18 atom/cm$^{-3}$. The second doped sublayer 114b is a doped polycrystalline silicon layer, and doping ions are indium ions, with a doping concentration from 1E20 atom/cm$^{-3}$ to 1E21 atom/cm$^{-3}$.

In summary, in the DMOS device with the junction field plate and its manufacturing method provided in the present disclosure, the drain region 128 is located on the surface of the semiconductor substrate 100. The source region 120 is located in the semiconductor substrate 100 at the bottom of the first trench 102. The gate electrode 122a is located at the bottom of the first trench 102. Therefore, compared with LDMOS, the lateral voltage resistance is changed to the longitudinal voltage resistance, which may reduce the size of the entire device, decrease Rdson, and greatly optimize the relationship between voltage resistance and Rdson. Further, the junction field plate 132 is formed in the DMOS device, which improves the effect on reducing surface resistance (Resurf). At the same time, due to the existence of the junction field plate 132, the depth of trenches in the DMOS device may be reduced, and thereby the depth-to-width ratio of trenches in the device is reduced, improving the feasibility of increasing a voltage resistance level. That is, further improvement in the voltage resistance level of the DMOS device may be achieved, without increasing the depth-to-width ratio of trenches, and there is no loss in device current capability. Furthermore, both the source region 120 and the drain region 128 in the DMOS device are led out on the same surface, which may be compatible with the technology for manufacturing the CMOS device. In addition, the second doped polycrystalline silicon layer 112 includes the first doped sublayer 114a and the second doped sublayer 114b located on the first doped sublayer 114a. The first doped sublayer 114a and the second doped sublayer 114b are of different conduction types. Therefore, in a case of the N-type gate electrode, the P-type doped layer may be directly connected to the potential of the gate electrode 122, which improves the effect of the junction field plate 132.

Further, here, the side surfaces of the second trench 104 and the first trench 102 are provided with a communication trench, so that the first doped sublayer 114a and the second doped sublayer 114b in the second trench 104 are electrically connected to the first doped sublayer 114a and the second doped sublayer 114b in the first trench 102. This allows that, after a gate voltage is added to the first doped sublayer 114a and the second doped sublayer 114b in the second trench 104 through the third lead-out structure 138, the gate voltage may be directly added to the first doped polycrystalline silicon layer 110 in the first trench 102 through the second doped sublayer 114b in the second trench 104 and the second doped sublayer 114b in the first trench 102. That is, while the gate voltage is added to the gate structure in the first trench 102, the gate voltage is directly added to the first doped polycrystalline silicon layer 110 in the first trench 102, without additionally conducting the gate voltage to the first doped polycrystalline silicon layer 110 in the first trench 102 through breakdown of PN junction. Therefore, in a case of the N-type gate electrode, the P-type doped layer may be directly connected to the potential of the gate electrode, which improves the switch capability of the gate electrode and the effect of the junction field plate.

In the embodiments of the present application, in the top view of FIG. 12, in a plane where the semiconductor substrate 100 is located, the first trench 102 and the second trench 104 form a trench similar to a "目" shape. In other embodiments of the present application, in ⊢ the top view of FIG. 12, in a plane where the semiconductor substrate 100 is located, the first trench 102 and the second trench 104 may form a comb-like structure, which includes a comb tooth portion and a comb handle portion connected to the comb tooth portion.

Figure 13:
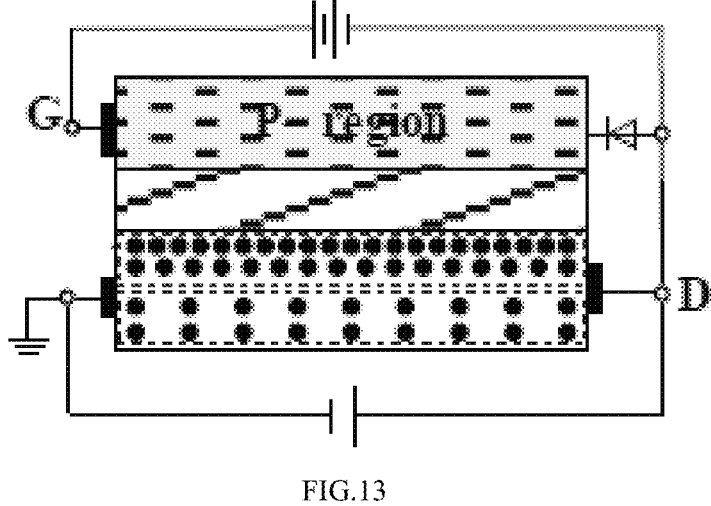
FIGS. 13 and 14 are schematic diagrams illustrating the operation of a junction field plate according to an embodiment of the present disclosure.
Figure 14:
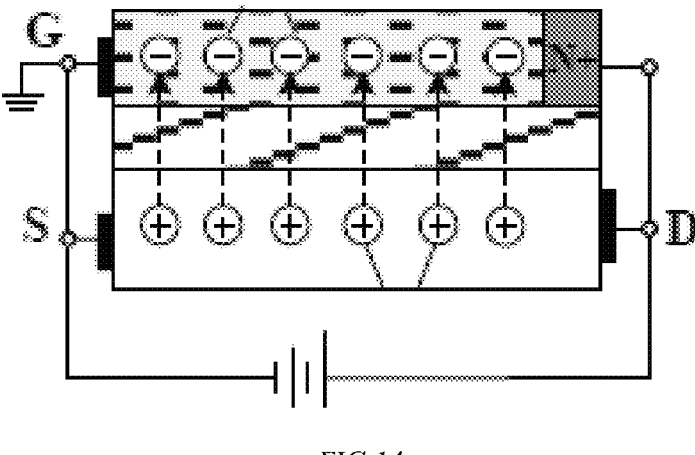

Further, FIGS. 13 and 14 are schematic diagrams illustrating the operation of a junction field plate according to an embodiment of the present disclosure. As shown in FIG. 13, when the gate voltage is greater than a threshold voltage, the first doped polycrystalline silicon layer 110 (in the junction field plate 132) has a positive charge, so that more electrons accumulate in the drift region 106, and a resistance of the drift region 106 decreases, improving the current capability. As shown in FIG. 14, when the gate voltage is equal to 0 and the drain voltage is greater than 0, PN junction reverse bias occurs in the drain region 128. Potential lines in the drift region 106 may be adjusted through potential lines in the first doped polycrystalline silicon layer 110 (in the junction field plate 132), so that the potential lines in the drift region 106 may be more evenly distributed in the drift region 106, achieving the effect on increasing voltage resistance.

The above description is only a description of the preferred embodiments of the present disclosure, which is not intended to limit the scope of the present disclosure. Any change, modification, etc. made to the present disclosure by those skilled in the art according to the disclosure shall fall within the protection scope of the claims.

The invention claimed is:

1. A method of manufacturing a DMOS device with a junction field plate, the method comprising:

providing a semiconductor substrate, in which a first trench is formed;

forming a first doped polycrystalline silicon layer with a first conduction type on the semiconductor substrate, wherein the first doped polycrystalline silicon layer covers a surface of the semiconductor substrate and a surface of the first trench;

performing a first doping process and a second doping process on the first doped polycrystalline silicon layer to form a second doped polycrystalline silicon layer on the surface of the semiconductor substrate and a portion of a bottom surface of the first trench, wherein the second doped polycrystalline silicon layer comprises a first doped sublayer with a second conduction type and a second doped sublayer with a first conduction type located on the first doped sublayer;

performing a heat treatment process, so that the second doped polycrystalline silicon layer in the first trench extends toward side surfaces of the first trench;

removing a portion of the second doped polycrystalline silicon layer to expose a portion of the bottom surface of the first trench;

forming a body region at a bottom of the first trench and forming a source region located in the body region;

performing a third doping process to form a drain region on the surface of the semiconductor substrate and a third doped sublayer with a second conduction type on a surface of the first doped polycrystalline silicon layer, wherein the second doped polycrystalline silicon layer, the first doped polycrystalline silicon layer, and the third doped sublayer on the side surfaces of the first trench serve as the junction field plate, and the first doped sublayer on the side surfaces of the first trench serves as a gate electrode; and forming a first lead-out structure electrically connected to the source region, a second lead-out structure electrically connected to the drain region and the third doped sublayer, and a third lead-out structure electrically connected to the gate electrode.

2. The method of manufacturing a DMOS device with a junction field plate according to claim 1, wherein providing the semiconductor substrate, in which the first trench is formed, comprises: forming a second trench in communication with the first trench in the semiconductor substrate;

forming the first doped polycrystalline silicon layer with the first conduction type on the semiconductor substrate, wherein the first doped polycrystalline silicon layer covers the surface of the semiconductor substrate and the surface of the first trench, comprises: the first doped polycrystalline silicon layer covers a surface of the second trench;

performing the first doping process and the second doping process on the first doped polycrystalline silicon layer to form the second doped polycrystalline silicon layer on the surface of the semiconductor substrate and the portion of the bottom surface of the first trench, wherein the second doped polycrystalline silicon layer comprises the first doped sublayer with the second conduction type and the second doped sublayer with the first conduction type located on the first doped sublayer, comprises: forming the second doped polycrystalline silicon layer on a portion of a bottom surface of the second trench;

performing the heat treatment process, so that the second doped polycrystalline silicon layer in the first trench extends toward the side surfaces of the first trench, comprises: so that the second doped polycrystalline silicon layer in the second trench extends toward side surfaces of the second trench;

after forming the body region and the source region located in the body region at the bottom of the first trench, and before performing the third doping process to form the drain region on the surface of the semiconductor substrate and the third doped sublayer with the second conduction type on the surface of the first doped polycrystalline silicon layer, wherein the second doped polycrystalline silicon layer, the first doped polycrystalline silicon layer, and the third doped sublayer on the side surfaces of the first trench serve as the junction field plate, and the first doped sublayer on the side surfaces of the first trench serves as the gate electrode, the method further comprises: removing the first doped polycrystalline silicon layer on the side surfaces of the second trench, wherein the second doped polycrystalline silicon layer in the second trench serves as a gate lead-out layer, and the gate lead-out layer is connected to the gate electrode; and forming the first lead-out structure electrically connected to the source region, the second lead-out structure electrically connected to the drain region and the third doped sublayer, and the third lead-out structure electrically connected to the gate electrode comprises: the third lead-out structure is connected to the gate lead-out layer to achieve electrical connection with the gate electrode.

3. The method of manufacturing a DMOS device with a junction field plate according to claim 1, wherein the first conduction type is of a P-type, and the second conduction type is of an N-type; forming the first doped polycrystalline silicon layer with the first conduction type on the semiconductor substrate comprises:

forming a polycrystalline silicon layer on the semiconductor substrate; and performing a P-type doping process on the polycrystalline silicon layer to form the first doped polycrystalline silicon layer, wherein a doping concentration for the first doped polycrystalline silicon layer is from 4E14 atom/cm$^{-3}$ to 1E16 atom/cm$^{-3}$, and a thickness of the first doped polycrystalline silicon layer is from 0.15 μm to 0.35 μm.

4. The method of manufacturing a DMOS device with a junction field plate according to claim 1, wherein the first conduction type is of a P-type, and the second conduction type is of an N-type; performing the first doping process and the second doping process on the first doped polycrystalline silicon layer comprises:

doping phosphonium ions, with a doping concentration from 1E17 atom/cm$^{-3}$ to 1E18 atom/cm$^{-3}$, in the first doping process; and doping indium ions, with a doping concentration from 1E20 atom/cm$^{-3}$ to 1E21 atom/cm$^{-3}$, in the second doping process.

5. The method of manufacturing a DMOS device with a junction field plate according to claim 2, wherein performing the heat treatment process, so that the second doped polycrystalline silicon layer in the first trench extends toward the side surfaces of the first trench, further comprises:

a diffusion speed of doping ions in the first doping process being faster than that in the second doping process, so that an extension length of the first doped sublayer in the first trench toward the side surfaces of the first trench is greater than that of the second doped sublayer in the first trench toward the side surfaces of the first trench, and an extension length of the first doped sublayer in the second trench toward the side surfaces of the second trench is greater than that of the second doped sublayer in the second trench toward the side surfaces of the second trench.

6. The method of manufacturing a DMOS device with a junction field plate according to claim 2, wherein performing the heat treatment process, so that the second doped polycrystalline silicon layer in the first trench extends toward the side surfaces of the first trench, further comprises:

the second doped polycrystalline silicon layer on the surface of the semiconductor substrate covers a portion of the side surfaces of the first trench and a portion of the side surfaces of the second trench.

7. The method of manufacturing a DMOS device with a junction field plate according to claim 2, wherein removing the portion of the second doped polycrystalline silicon layer to expose the portion of the bottom surface of the first trench comprises:

forming a first patterned photoresist layer, wherein the first patterned photoresist layer fills the second trench and extends to cover a portion of the second doped polycrystalline silicon layer on the semiconductor substrate, and another portion of the second doped polycrystalline silicon layer in the first trench and on the semiconductor substrate is exposed; and performing an etching process on a portion of the second doped polycrystalline silicon layer in the first trench and the exposed second doped polycrystalline silicon layer on the semiconductor substrate to remove the portion of the second doped polycrystalline silicon layer in the first trench and the exposed second doped polycrystalline silicon layer on the semiconductor substrate.

8. The method of manufacturing a DMOS device with a junction field plate according to claim 1, wherein the first conduction type is of a P-type, and the second conduction type is of an N-type; forming the body region and the source region located in the body region at the bottom of the first trench comprises:

performing a P-type doping process on the semiconductor substrate at the bottom of the first trench to form the body region in the semiconductor substrate at the bottom of the first trench; and performing an N-type doping process on a portion of the body region to form the source region in the body region.

9. The method of manufacturing a DMOS device with a junction field plate according to claim 2, wherein removing the first doped polycrystalline silicon layer on the side surfaces of the second trench, wherein the second doped polycrystalline silicon layer in the second trench serves as the gate lead-out layer, and the gate lead-out layer is connected to the gate electrode, comprises:

filling a hard mask layer in the first trench and the second trench, wherein the hard mask layer extends to cover the second doped polycrystalline silicon layer on the surface of the semiconductor substrate;

removing a portion of the hard mask layer by using a wet or dry etching process to expose the second doped polycrystalline silicon layer on the surface of the semiconductor substrate;

removing the second doped polycrystalline silicon layer on the surface of the semiconductor substrate by using a dry etching process;

forming a second patterned photoresist layer, wherein the second patterned photoresist layer covers the hard mask layer in the first trench and the first doped polycrystalline silicon layer; and removing the first doped polycrystalline silicon layer on the side surfaces of the second trench by using a dry etching process.

10. A DMOS device with a junction field plate, the device comprising:

a semiconductor substrate, in which a first trench is formed;

a first doped polycrystalline silicon layer and a second doped polycrystalline silicon layer formed on side walls of the first trench, wherein the second doped polycrystalline silicon layer is closer to a bottom of the first trench than the first doped polycrystalline silicon layer, and the second doped polycrystalline silicon layer includes a first doped sublayer and a second doped sublayer located on the first doped sublayer;

a third doped sublayer formed on the side walls of the first trench, wherein the third doped sublayer is closer to a top of the first trench than the first doped polycrystalline silicon layer, the first doped sublayer in the first trench serves as a gate electrode, and the first doped polycrystalline silicon layer, the second doped polycrystalline silicon layer, and the third doped sublayer in the first trench serve as the junction field plate, wherein the first doped polycrystalline silicon layer is of a first conduction type, the first doped sublayer is of a second conduction type, the second doped sublayer is of the first conduction type, and the third doped sublayer is of the second conduction type;

a body region in the semiconductor substrate formed at the bottom of the first trench and a source region located in the body region;

a drain region formed on a surface of the semiconductor substrate; and a first lead-out structure electrically connected to the source region, a second lead-out structure electrically connected to the drain region and the third doped sublayer, and a third lead-out structure electrically connected to the gate electrode.

11. The DMOS device with a junction field plate according to claim 10, wherein a second trench in communication with the first trench is further formed in the semiconductor substrate, the second doped polycrystalline silicon layer covers a bottom surface of the second trench, the second doped polycrystalline silicon layer in the second trench serves as a gate lead-out layer, the gate lead-out layer is connected to the gate electrode, and the third lead-out structure is connected to the gate lead-out layer to achieve electrical connection with the gate electrode.

12. The DMOS device with a junction field plate according to claim 10, wherein, in the first trench, in a direction from the bottom of the first trench to a trench opening of the first trench, the second doped polycrystalline silicon layer, the first doped polycrystalline silicon layer, and the third doped sublayer are sequentially in adjacent contact and cover side surfaces of the first trench.

13. The DMOS device with a junction field plate according to claim 10, wherein the second doped sublayer is located in the first doped sublayer, and in the first trench, a bottom surface of the first doped polycrystalline silicon layer is connected to the first doped sublayer and the second doped sublayer.

14. The DMOS device with a junction field plate according to claim 11, wherein, in a first direction, the second trench is in communication with the first trench; in a second direction, the second trench is separated from the first trench, wherein the first direction is perpendicular to the second direction.

15. The DMOS device with a junction field plate according to claim 10, wherein the body region surrounds the bottom of the first trench.

16. The DMOS device with a junction field plate according to claim 11, wherein, in the first trench, in a direction from the bottom of the first trench to a trench opening of the first trench, the second doped polycrystalline silicon layer, the first doped polycrystalline silicon layer, and the third doped sublayer are sequentially in adjacent contact and cover side surfaces of the first trench.

17. The DMOS device with a junction field plate according to claim 11, wherein the second doped sublayer is located in the first doped sublayer, and in the first trench, a bottom surface of the first doped polycrystalline silicon layer is connected to the first doped sublayer and the second doped sublayer.

18. The DMOS device with a junction field plate according to claim 11, wherein the body region surrounds the bottom of the first trench.

19. The DMOS device with a junction field plate according to claim 11, further comprising: a drift region formed in the semiconductor substrate between the first trench and the second trench.

20. The DMOS device with a junction field plate according to claim 10, wherein the first doped sublayer is a doped polycrystalline silicon layer, and doping ions are phosphonium ions, with a doping concentration from $1E17$ atom/cm$^{-3}$ to $1E18$ atom/cm$^{-3}$; and the second doped sublayer is a doped polycrystalline silicon layer, and doping ions are indium ions, with a doping concentration from $1E20$ atom/cm$^{-3}$ to $1E21$ atom/cm$^{-3}$.

* * * * *